US011036144B2

(12) United States Patent
Klosiewicz et al.

(10) Patent No.: US 11,036,144 B2
(45) Date of Patent: Jun. 15, 2021

(54) LITHOGRAPHIC METHOD AND APPARATUS

(71) Applicant: ASML NETHERLANDS B.V., Veldhoven (NL)

(72) Inventors: Przemyslaw Aleksander Klosiewicz, Antwerp (BE); Bogathi Vishnu Vardhana Reddy, Eindhoven (NL); Syed Umar Hassan Rizvi, Danbury, CT (US); James Robert Downes, Eindhoven (NL)

(73) Assignee: ASML Netherlands B. V., Veldhoven (NL)

( * ) Notice: Subject to any disclaimer, the term of this patent is extended or adjusted under 35 U.S.C. 154(b) by 0 days.

(21) Appl. No.: 16/955,324

(22) PCT Filed: Dec. 3, 2018

(86) PCT No.: PCT/EP2018/083364
§ 371 (c)(1),
(2) Date: Jun. 18, 2020

(87) PCT Pub. No.: WO2019/120968
PCT Pub. Date: Jun. 27, 2019

(65) Prior Publication Data
US 2021/0011389 A1    Jan. 14, 2021

(30) Foreign Application Priority Data

Dec. 19, 2017   (EP) .................................... 17208336

(51) Int. Cl.
*G03F 7/20*   (2006.01)
(52) U.S. Cl.
CPC .......... *G03F 7/70266* (2013.01); *G03F 7/705* (2013.01)

(58) Field of Classification Search
CPC ... G03F 7/705; G03F 7/70266; G03F 7/70825
See application file for complete search history.

(56) References Cited

U.S. PATENT DOCUMENTS

| 2005/0206880 A1 | 9/2005 | Fukugawa et al. |
| 2007/0188726 A1 | 8/2007 | Shimizu et al. |
| (Continued) | | |

FOREIGN PATENT DOCUMENTS

| DE | 102015222377 | 11/2016 |
| WO | 2016206916 | 12/2016 |

OTHER PUBLICATIONS

International Search Report and Written Opinion issued in corresponding PCT Patent Application No. PCT/EP2018/083364, dated Feb. 28, 2019.

(Continued)

*Primary Examiner* — Steven Whitesell Gordon
(74) *Attorney, Agent, or Firm* — Pillsbury Winthrop Shaw Pittman LLP

(57) ABSTRACT

A method of determining a configuration of a projection system for a lithographic apparatus as an implementation of a quadratic programming problem with a penalty function. The method includes: receiving dependencies of one or more optical properties of the projection system on a configuration of a plurality of manipulators of the projection system; receiving a plurality of constraints which correspond to physical constraints of the manipulators; finding an initial configuration of the manipulators; and iteratively finding an output configuration of the manipulators. The iteration includes repeating the following steps: determining a set of the plurality of constraints that are violated; determining an updated configuration of the manipulators, the updated configuration of the manipulators being dependent on the set of the plurality of constraints that are violated and (Continued)

a penalty strength; and increasing the penalty strength. These steps are repeated until a convergence criterion is met.

20 Claims, 4 Drawing Sheets

(56) References Cited

U.S. PATENT DOCUMENTS

| | | | |
|---|---|---|---|
| 2009/0103065 A1* | 4/2009 | Yoshihara | G03F 7/70258 355/52 |
| 2010/0302524 A1 | 12/2010 | Shigenobu et al. | |
| 2011/0181855 A1* | 7/2011 | Bittner | G03F 7/70191 355/55 |
| 2016/0252824 A1 | 9/2016 | Bittner et al. | |
| 2017/0115576 A1 | 4/2017 | Bittner et al. | |

OTHER PUBLICATIONS

Armand, Paul et al.: "A Mixed Logarithmic Barrier-Augmented Lagrangian Method for Nonlinear Optimization", Journal of Optimization Theory and Applications, vol. 173, No. 2, Feb. 1, 2017.
Milde, T. et al.: "Toward a paraxial pre-design of zoom lenses", Proc. of SPIE, vol. 9580, 2015.

* cited by examiner

LITHOGRAPHIC METHOD AND APPARATUS

CROSS-REFERENCE TO RELATED APPLICATIONS

This application is the U.S. national phase entry of PCT Patent Application No. PCT/EP2018/083364, which was filed on Dec. 3, 2018, which claims the benefit of priority of European Patent Application No. 17208336.2 which was filed on 19 Dec. 2017 and which is incorporated herein in its entirety by reference.

FIELD

The present invention relates to a method of determining a configuration of a projection system. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Radiation that has been patterned by the patterning device is focussed onto the substrate using a projection system. The projection system may include a plurality of optical elements (e.g. lenses) which may be adjusted using one or more manipulators. The manipulators may be controlled in order to bring about a desired wavefront at the substrate. For example, a configuration of the manipulators which brings about a desired wavefront at the substrate may be determined and the manipulators moved into that configuration.

It is an object of the present invention to provide a method of determining a configuration of a projection system which at least partially addresses one or more of the problems of the prior art, whether identified herein or elsewhere.

SUMMARY

According to a first aspect of the invention, there is provided a method of determining a configuration of a projection system for a lithographic apparatus, wherein the projection system comprises a plurality of optical elements and a plurality of manipulators and wherein the manipulators are operable to manipulate the optical elements so as to adjust the optical properties of the optical elements, thereby adjusting the optical properties of the projection system, wherein the method is an implementation of a quadratic programming problem with a penalty function, the method comprising: receiving dependencies of the optical properties of the projection system on a configuration of the manipulators; receiving a plurality of constraints which correspond to the physical constraints of the manipulators; finding an initial configuration of the manipulators, the initial configuration of the manipulators being a configuration that would achieve a desired wavefront pattern in the absence of the plurality of constraints; and repeating the following steps: (a) determining a set of the plurality of constraints that are violated; (b) determining an updated configuration of the manipulators, the updated configuration of the manipulators being dependent on the set of the plurality of constraints that are violated and a penalty strength; and (c) increasing the penalty strength; wherein steps (a) to (c) are repeated until a convergence criterion is met, the determined configuration of the projection system being the last updated configuration of the manipulators determined before the convergence criterion was met.

The method according to the first aspect of the invention has a number of benefits, as now discussed.

An advantage of the quadratic programming based techniques over known algorithms for optimizing the configuration of the manipulators of a projection system of a lithographic apparatus is the ability to optimally use the entire available manipulator range. Therefore, quadratic programming can allow an optimum solution to be found.

Since the initial configuration of the manipulators is a configuration that would achieve a desired wavefront pattern in the absence of the plurality of constraints, in general, the method of the first aspect allows a solution to be approached from outside the feasible region as defined by the constraints of equation. As the penalty strength increases (with each iteration of the algorithm), the solution moves closer to the feasible region.

It will be appreciated that the initial configuration of the manipulators may be dependent on: (a) the received dependencies of the optical properties of the projection system on a configuration of the manipulators; and (b) the desired wavefront pattern in the absence of the plurality of constraints. However, the initial configuration of the manipulators is independent of the plurality of constraints.

In the determination of an updated configuration of the manipulators, the updated configuration of the manipulators may be determined in dependence on all of the set of the plurality of constraints that are violated at substantially the same time or at the same step.

It will be appreciated that in this context the updated configuration of the manipulators being determined in dependence on all of the set of the plurality of constraints that are violated at substantially the same time is intended to mean that all of the set of the plurality of constraints that are violated are accounted for during the same computational step or computational steps.

This approach, wherein multiple violated constraints are accounted for simultaneously in each iteration, is in contrast to, for example, the active set method for solving quadratic programming problems. The active set method requires each active constraint to be separately considered during each iteration of the algorithm. In general, the active set method requires at least iterations $n_{AS}$, with $n_{AS}$ being the number of active (satisfied equality) constraints in the solution point. By approaching the solution from outside the feasible region and simultaneously taking into account multiple violated constraints, the method of the first aspect can converge on a solution in fewer iterations. In turn, this means that the method will require less computational resources to converge on a solution.

The first aspect therefore advantageously provides a method which can be performed quickly and which can find a solution configuration of the manipulators which is close to an optimum solution. This may allow the configuration of the manipulators to be quickly and accurately updated during a lithographic process and/or between lithographic processes. In particular, it has been found that sufficiently complicated problems, which would require a relatively large number of iterations of an active set algorithm to solve, can be solved quicker with the penalty method according to the first aspect of the invention. Put differently, the method according to the first aspect of the invention has been found to be quicker than active set methods in situations where many constraints are active at the solution point, which can often be the case when optimizing the configuration of the manipulators of the projection system of a lithographic apparatus.

The penalty function may be a quadratic penalty function.

The use of a quadratic penalty function simplifies the elimination of Lagrange multipliers and slack variables from the equations of motion, as a result the step of determining an updated configuration of the manipulators simplified.

Determining an updated configuration of the manipulators may involve: calculating of a configuration determining matrix and a configuration determining vector, determining any inverse of the configuration determining matrix and determining the updated configuration by multiplying the inverse of the configuration determining matrix by the configuration determining vector.

It will be appreciated by the skilled person that rather than calculating the matrix and vector separately and then combining them to determine an updated configuration of the manipulators, these steps may be performed as a single step, or may be split into a different set of sub-steps that are equivalent.

The dependencies of the optical properties of the projection system on a configuration of the manipulators may be stored as a lens dependency matrix whose elements may correspond with the derivatives of the manipulator induced wavefront aberrations with respect to the configuration of the manipulators.

A desired wavefront pattern may be represented by a vector whose elements express the desired wavefront pattern over an exposure field. For example, the elements may represent the Zernike coefficients of the desired wavefront pattern at one or more field points.

The plurality of constraints, which correspond to the physical constraints of the manipulators, may be represented as linear inequalities. That is, inequalities involving linear combinations of the manipulators. Such linear inequalities may be represented by a constraint matrix and one or more vectors which define the lower and/or upper bounds of the constraints.

The configuration determining matrix may be a sum of: an unconstrained configuration determining matrix which is dependent on the dependencies of the optical properties of the projection system on a configuration of the manipulators; and a matrix which is proportional to the penalty strength.

The matrix which is proportional to the penalty strength may be dependent on the plurality of constraints and on the set of constraints that are violated.

The configuration determining vector may be a sum of: an unconstrained configuration determining vector, which is dependent on: the dependencies of the optical properties of the projection system on a configuration of the manipulators, and the desired wavefront pattern; and a vector which is proportional to the penalty strength.

The vector, which is proportional to the penalty strength, may be dependent on the plurality of constraints and on the set of constraints that are violated.

The step of determining a set of the plurality of constraints that are violated may comprise determining a slack variable for each of the plurality of constraints, the value of the slack variables indicating whether or not that constraint is violated.

For example, constraints that are violated may have a negative slack variable. The slack variable may be determined using the plurality of constraints and a previously determined configuration of the manipulators (either the initial configuration or a previously determined updated configuration).

The step of determining a set of the plurality of constraints that are violated may comprise determining a delta variable for each of the plurality of constraints, the delta variable only being non-zero if that constraint is violated.

The delta variables may be calculated from slack values that have already been calculated.

Any suitable initial penalty value may be used. For example, in one example the initial penalty value is set to 1. In another example the initial penalty value is set to 10. In addition, the initial penalty value $\rho_0$ may be a parameter of the algorithm.

The step of increasing the penalty strength may comprise doubling the penalty strength.

The convergence criterion may include any of the following: a step size tolerance, stagnation of the number of active constraints, or stagnation of the cost function.

The method may further comprise determining the dependency of the optical properties of the projection system on the configuration of the manipulators.

Determining the dependency of the optical properties of the projection system on the configuration of the manipulators may comprise changing the configuration of the manipulators and measuring a resulting change in the optical properties of the projection system.

The method may further comprise adjusting the configuration of the manipulators to the solution configuration of the manipulators.

According to a second aspect of the present invention there is provided a method of performing a lithographic exposure comprising: determining a configuration of a projection system of a lithographic apparatus according to the method of the first aspect of the invention; adjusting the configuration of the projection system using the determined configuration; projecting a patterned radiation beam onto a substrate using the projection system.

According to a third aspect of the present invention there is provided a computer readable medium carrying a computer program comprising computer readable instructions configured to cause a computer to carry out a method according to the first aspect of the invention.

According to a fourth aspect of the present invention there is provided a computer apparatus comprising: a memory storing processor readable instructions, and a processor arranged to read and execute instructions stored in said memory, wherein said processor readable instructions comprise instructions arranged to control the computer to carry out the method according to the first aspect of the invention.

According to a fifth aspect of the present invention there is provided a controller configured to control a projection system for a lithographic apparatus, wherein the projection system comprises a plurality of optical elements and a plurality of manipulators operable to manipulate the optical elements so as to adjust the optical properties of the optical elements, thereby adjusting the optical properties of the projection system, the controller being configured to implement a quadratic programming problem with a penalty function by: receiving dependencies of the optical properties of the projection system on a configuration of the manipulators; receiving a plurality of constraints which correspond to the physical constraints of the manipulators; finding an initial configuration of the manipulators, the initial configuration of the manipulators being a configuration that would achieve a desired wavefront pattern in the absence of the plurality of constraints; and repeating the following steps: (a) determining a set of the plurality of constraints that are violated; (b) determining an updated configuration of the manipulators, the updated configuration of the manipulators being dependent on the set of the plurality of constraints that are violated and a penalty strength; and (c) increasing the penalty strength; wherein steps (a) to (c) are repeated until a convergence criterion is met, the determined configuration of the projection system being the last updated configuration of the manipulators determined before the convergence criterion was met.

According to a sixth aspect of the present invention there is provided a projection system for a lithographic apparatus, the projection system comprising: a plurality of optical elements; a plurality of manipulators operable to manipulate the optical elements so as to adjust the optical properties of the optical elements, thereby adjusting the optical properties of the projection system; and a controller according to the fifth aspect of the present invention.

According to a seventh aspect of the present invention there is provided a lithographic apparatus comprising: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; and a projection system according to the sixth aspect of the present invention.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
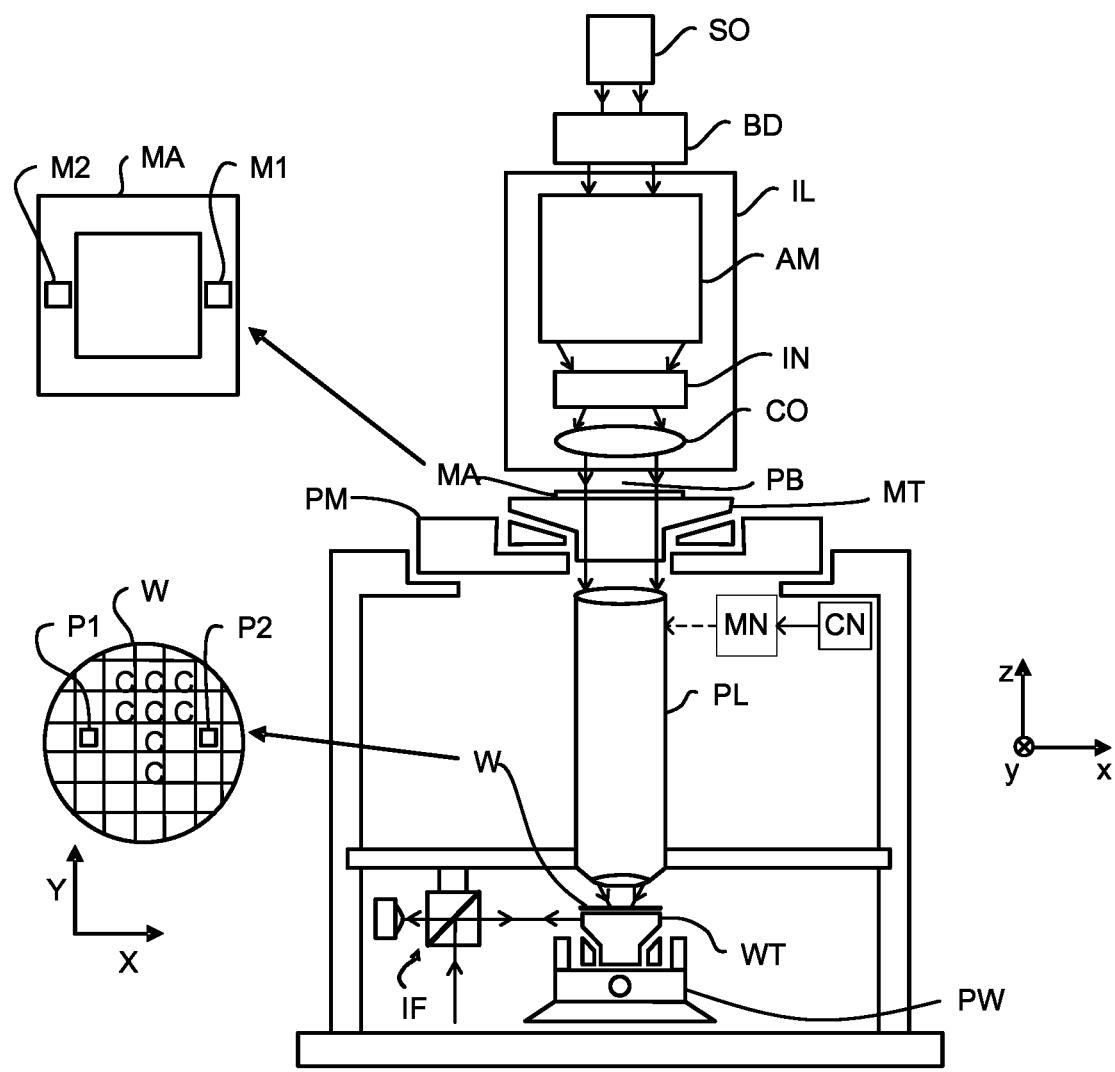
FIG. 1 is a schematic illustration of a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 4-20 nm), as well as particle beams, such as ion beams or electron beams.

The term "patterning device" used herein should be broadly interpreted as referring to a device that can be used to impart a radiation beam with a pattern in its cross-section. For example, a radiation beam may be imparted with a pattern in its cross-section in order to create a pattern in a target portion of a substrate. Additionally or alternatively a radiation beam may be imparted with a pattern in its cross-section in order to illuminate a sensor apparatus with a patterned radiation beam. It should be noted that when a pattern is created in a target portion of a substrate, the pattern imparted to a radiation beam may not exactly correspond to a desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus. The apparatus comprises:
- an illumination system (illuminator) IL to condition a beam PB of radiation (e.g. UV radiation or DUV radiation).
- a support structure MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained by inserting an optic which provides that illumination mode into the illuminator IL.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:
1. In step mode, the support structure MT and the substrate table WT are kept essentially stationary, while an entire pattern imparted to the beam PB is projected onto a target portion C in one go (i.e. a single static exposure). The substrate table WT is then shifted in the x and/or y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane).

The relative phase of the projection system PL in its pupil plane may be determined by projecting radiation from an object plane of the projection system PL (i.e. the plane of the patterning device MA), through the projection system PL and using a shearing interferometer to measure a wavefront (i.e. a locus of points with the same phase). The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL.

The projection system PL may comprise a plurality of lens elements and may further comprise a controller CN and a plurality of manipulators MN (shown schematically as a single box in FIG. 1) for adjusting the lens elements so as to correct for aberrations (any type of phase variation across the pupil plane throughout the field). To achieve this, the manipulators MN (e.g. actuators) are operable to manipulate lens elements within the projection system PL in one or more different ways so as to alter their optical properties. The controller CN may control the manipulators so as to bring about desired wavefronts at the substrate W.

The manipulators MN may comprise any combination of elements which are operable to change the optical properties of the lens elements, thereby changing the optical properties of the projection system PL. The manipulators MN may comprise, for example, one or more actuators configured to alter the position, orientation and/or the shape of the lens elements. The manipulators MN may comprise, for example, actuators arranged to exert a force on sides of the lens element and/or one or more heating elements configured to heat one or more regions of a lens element, thereby altering the optical properties of the lens element and the optical properties of the projection system. The projection system may have a co-ordinate system wherein its optical axis extends in the z direction. Displacement of lens elements (by the manipulators MN) may be in any direction (x, y, z or a combination thereof). Tilting of lens elements (by the manipulators MN) is typically out of a plane perpendicular to the optical axis, by rotating about axes in the x or y directions although a rotation about the z axis may be used for non-rotationally symmetric aspherical lens elements. Deformation of lens elements may include both low frequency shapes (e.g. astigmatic) and high frequency shapes (e.g. free form aspheres). Deformation of a lens element may be performed for example by using actuators to exert force on sides of the lens element and/or by using heating elements to heat selected regions of the lens element. In general, it may not be possible to adjust the projection system PL to correct for apodizations (transmission variation across the pupil plane). The transmission map of a projection system PL may be used when designing masks MAs for the lithographic apparatus LA.

Note that, whilst schematically indicated in FIG. 1 as being operable to manipulate lens elements within the projection system PL in one or more different ways so as to alter their optical properties, in general, the manipulators MN may also be operable to move the support structure MT and/or the substrate table WT to provide additional control over aberrations. Additionally or alternatively, the manipulators MN may also be operable to control the wavelength of the radiation beam PB (for example via a suitable control signal to the radiation source SO) to provide additional control over aberrations. Any reference to manipulators MN below should be construed accordingly.

The controller CN is operable to determine a suitable configuration of the manipulators MN which causes wavefronts which are formed at the substrate W to approximate a desired wavefront pattern. A desired wavefront pattern may for example, be wavefront pattern in which aberrations at the substrate W are reduced or minimised. Wavefront aberrations may, for example, be expressed as a root mean square (RMS) wavefront error at the substrate W. It may be desirable to determine a configuration of the manipulators MN which reduces or minimises the RMS wavefront error at the substrate W.

The determination of a suitable configuration of the manipulators MN by the controller CN may be performed periodically and the manipulators MN may be periodically adjusted according to the determination. For example, multiple target portions C on a substrate W may be exposed during a process referred to as an exposure process. Subsequently a new substrate W may be loaded onto the substrate table WT (or alternatively a new substrate table WT holding a new substrate W may be moved into position to receive radiation) so as to expose target portions C of the new substrate W as part of a new exposure process.

A desired wavefront pattern at the substrate W which is being exposed may be different during different exposure processes. A suitable configuration of the manipulators MN which brings about a desired wavefront pattern at the substrate W may therefore be determined between exposure processes and the configuration of the manipulators updated accordingly.

Additionally or alternatively the properties of optical elements which form the projection system PL may change during an exposure process. For example, lens elements may undergo local heating during an exposure process which may cause changes in the optical properties of the lens elements. An adjustment to the lens elements may therefore be performed which accounts for any changes in the optical properties of the lens elements which occur over time (e.g. due to heating). For example, a new configuration of the manipulators MN may be determined between exposure processes which accounts for any changes in the optical properties of the lens elements which may have occurred during the previous exposure process.

In some embodiments a configuration of the manipulators MN may be determined which corrects for wavefront aberrations which are caused outside of the projection system PL. For example, wavefront aberrations may be introduced at a patterning device MA in a lithographic apparatus LA (e.g. due to localised heating of the patterning device MA). Wavefront aberrations which are introduced at the patterning device MA (or elsewhere outside of the projection system PL) may be corrected by determining a manipulator configuration which serves to correct for the aberrations. In addition, localised heating of the substrate W may cause the substrate W to deform. It will be appreciated that the deformation of the substrate W is not an optical wavefront aberration. However, in some embodiments a configuration of the manipulators MN may be determined which corrects this deformation of the substrate W (for example by introducing a compensating wavefront aberration that is substantially matched to the deformation of the substrate W such that these two effects substantially cancel each other out). The manipulator configuration may subsequently be updated according to the determined manipulator configuration. In some embodiments the manipulator configuration may be updated during an exposure process in order to correct for aberrations introduced outside of the projection system PL and/or for deformation of the substrate W.

In general, determining a suitable manipulator configuration and updating the manipulator configuration according to the determined manipulator configuration may allow wavefront aberrations caused inside and/or outside of the projection system PL to be corrected for. For example, wavefront aberrations which are caused by heating of the patterning device MA (which causes deformation of the patterning device MA) and/or wavefront aberrations which are caused by heating of optical elements (e.g. lenses) in the projection system PL may be corrected for. In addition, determining a suitable manipulator configuration and updating the manipulator configuration according to the determined manipulator configuration may allow deformation of the substrate W to be corrected for. It will be appreciated that the deformation of the substrate W is not an optical wavefront aberration. Effectively, if the manipulator configuration is used to correct for deformation of the substrate W, this may involve introducing a wavefront aberration that is substantially matched to the deformation of the substrate W such that these two effects substantially cancel each other out. It will be appreciated that for such embodiments, such compensating wavefront aberrations (that are substantially matched to the deformation of the substrate W) adjust a desired wavefront pattern.

A determination of the configuration of the manipulators MN which brings about a desired wavefront pattern is based upon knowledge of the dependency of the wavefront pattern on the configuration of the manipulators MN. The dependency of the wavefront pattern on the configuration of the manipulators MN may be referred to as the lens dependencies. The lens dependencies may be determined, for example, during a calibration process. For example, a projection system PL may be calibrated by projecting radiation using the projection system PL and measuring the radiation which is output from the projection system PL. The configuration of the manipulators MN may be adjusted and a resulting change in the radiation which is output from the projection system PL may be measured in order to derive the dependency of the optical properties of the projection system PL on the configuration of the manipulators (i.e. the lens dependencies).

Radiation which is output from the projection system PL may be measured in order to determine wavefront aberrations caused by the projection system PL. Wavefront aberrations may, for example, be measured using an interferometer (e.g. a shearing interferometer).

Additionally or alternatively wavefront aberrations to be corrected can be determined by modelling of the projection system PL. For example, modelling of the projection system PL may be used to determine wavefront aberrations which occur due to heating of the lens elements (e.g. during an exposure process). Modelling of the wavefront aberrations which occur due to heating of the lens elements may be referred to as a lens heating model. A lens heating model may be used to update the manipulator configuration during or between exposure process by accounting for heating of the lens elements which occur during an exposure process.

The lens dependencies may be expressed as a lens dependency matrix C whose elements correspond with the derivatives of the manipulator induced wavefront aberrations with respect to the configuration of the manipulators MN. That is, the lens dependency matrix C represents the change in a wavefront which is caused by a given change in the configuration of the manipulators MN. The lens dependency matrix C may include $n_r \times n_v$ elements, where $n_r = n_p \times n_z$, $n_p$ is the number of positions (e.g. positions in a field plane) at which the wavefront is evaluated, $n_z$ is the number of terms with which the wavefront is evaluated (e.g. a number of Zernike polynomial orders which are used to represent the wavefront) and $n_v$ is the number of variables on which the wavefront depends at each position (i.e. the number of manipulators MN)

The lens dependency matrix C represents a forward model which maps a given configuration of the manipulators MN to a resultant wavefront pattern at the substrate W. Determining a suitable configuration of the manipulators MN which brings about a desired wavefront pattern therefore amounts to an inverse problem which may be solved by inverting the forward model C. In general, there may not be an exact solution to the problem which brings about the desired wavefront pattern and thus the problem is ill-posed. The problem may therefore be reduced to minimizing a cost function F The cost function F may be expressed by:

$$F(x) = \frac{1}{2} \| C \cdot x - d \|^2 \qquad (1)$$

where x is a vector with $n_v$ elements which expresses the configuration of the manipulators MN and d is a vector with $n_r$ elements which expresses the desired wavefront pattern over an exposure field. The minimisation of a cost function F as expressed by equation (1) is of the form of a least squares problem. The double vertical bars in equation (1) represent the norm of the expression inside the double vertical bars. In the embodiments which are described below the norm may be evaluated as the Euclidean norm (2-norm) of the expression inside the double vertical bars. However, in other embodiments, the norm may be evaluated as other forms of the norm (e.g. the uniform or maximum norm). Evaluation of the norm as the Euclidean norm (2-norm) may provide computational efficiency benefits when compared to, for example, evaluating the maximum norm. In some embodiments, the Euclidean norm (2-norm) may therefore be used to approximate a maximum norm in order to improve the computational efficiency of the evaluation.

In general, the configuration of the manipulators MN is constrained. For example, each manipulator may have a limited range over which it may move, may have a maximum acceleration with which it can accelerate and may have a maximum velocity with which it can move. A manipulator which is configured to apply a heating to a lens element may, for example, have a limited rate at which it can heat a lens element and may have a limited temperature range at which it can operate. Manipulators may be constrained by one or more of the physical constraints described above and/or one or more other physical constraints not mentioned herein. The physical constraints of the manipulators serves to limit the configurations of the manipulators which are physically realisable. The physical constraints of the manipulators may also limit a change in the configuration of the manipulators which be achieved in a given time frame. This may be important, for example, when there is a limited time frame during which manipulator configuration can be updated. For example, between exposure processes a limited time frame may be provided during which the manipulator configuration can be updated and thus this may limit the change in manipulator configuration which is physically realisable between exposure processes. Note that the available range of each manipulator may vary dependent on which stage of an exposure process production sequence the lithographic apparatus is at. For example, there may be more time available for adjustments via the manipulators between exposure of different substrates W than there is between exposure of different target regions C of the same substrate W.

Therefore, the solution to the problem as expressed by equation (1) may in some cases represent a configuration of the manipulators MN which is not physically realisable due to the constraints of the manipulators MN. Rather, it is desirable to minimise the cost function F subject to satisfying the constraints of the manipulators MN. The constraints of the manipulators may be expressed by:

$$b_l \leq A \cdot x \leq b_u \quad (2)$$

where A is a constraint matrix, $b_l$ is the lower bounds of the constraints, and $b_u$ is the upper bounds of the constraints. The constraint matrix A is formed of $n_c \times n_v$ elements, where $n_c$ is the number of constraints.

A solution $x_{sol}$ to the constrained problem of minimising the cost function F may be expressed by equation (3).

$$x_{sol} = \min(F(x)), \text{ subject to } b_l \leq Ax \leq b_u \quad (3)$$

The controller CN may receive the lens dependencies C and the constraints A and may compute a solution configuration of the manipulators MN using the lens dependencies C and the constraints A. In some embodiments the lens dependencies C and the constraints A may be stored in memory and may be sent to the controller for computation of a solution configuration of the manipulators MN. In some embodiments a plurality of different lens dependencies C and/or constraints A may be stored in memory and the controller may select a suitable lens dependencies matrix C and constraints matrix A to receive and to use to compute a solution configuration of the manipulators MN.

The problem of equation (3) may be solved in a number of different ways. Embodiments of the present invention involve a new technique for solving this problem, as now described.

In general, the re-calculation of a set point for the manipulators MN (i.e. a solution to the problem of equation (3)) should be performed within a certain time period. The allowed time for such a calculation, may be dependent on which stage of an exposure process production sequence the lithographic apparatus is at. For example, there may be more time available for adjustments via the manipulators MN between exposure of different substrates W than there is between exposure of different target regions C of the same substrate W.

In addition, in order to maintain system throughput at a certain level, the movement of manipulators MN based on the modelling output or computed lens set-points should not take more than a specified amount of time.

Due to these time constraints, existing methods for computation of a set-point for the manipulators MN use either (a) ordinary least squares minimisation with strong damping to ensure that the range constraints are satisfied; or (b) a Generalized-Tikhonov method.

Using the first of these known methods (ordinary least squares minimisation), a solution may be sought by performing a singular value decomposition of the lens dependency matrix C:

$$C = U \cdot S \cdot V^T, \quad (4)$$

where U and V are unitary matrices and S is a diagonal matrix having $n_r \times n_v$ elements with non-negative numbers on the diagonal. The superscript "T" used in equation (4) denotes the transpose of the matrix V. Singular value decomposition as expressed by equation (4) is a well-known form of factorization of a matrix (in this case the lens dependency matrix C) the computation of which will be well understood by a person having ordinary skill in the art. The diagonal elements of the diagonal matrix S are referred to as the singular values $\sigma_i$ of the lens dependency matrix C. The singular values $\sigma_i$ are generally ordered on the diagonal of the matrix S in decreasing size such that $\sigma_1 \geq \sigma_2 \geq \sigma_3 \ldots \geq \sigma_m$, where m is the total number of singular values. The columns of the unitary matrix U and the unitary matrix $V^T$ each form a set of orthonormal vectors.

The factorization of the lens dependency matrix C by singular value decomposition may be used to find a solution to the least squares problem in the absence of the constraints given by equation (2). The solution to the unconstrained least squares problem can be shown to be given by equation (5).

$$x_{sol} = VS^{-1}U^T d = \sum_{i=1}^{m} \frac{(U^T \cdot d)_i}{\sigma_i} \cdot V_{:,i} \quad (5)$$

The superscript "T" used in equation (5) denotes the transpose of the matrix U. Whilst equation (5) may be used to find a solution to the least squares problem, the solution may not satisfy the manipulator constraints as expressed by equation (2). One approach to finding a solution which satisfies the manipulator constraints is to start the summation expressed by the right hand side of equation (5) and at each value of i evaluate whether or not the constraints are met. In the event that the constraints are not met, the summation may be terminated and a solution returned which corresponds to the last step at which the constraints are met. Such an approach may be referred to as a truncated singular value decomposition method.

Using the second of these known methods (a Generalized-Tikhonov method) the cost function F of equation (1) may be replaced by a Tikhonov cost function $F_T$ which is given by:

$$F_T = \|C \cdot x - d\|^2 + \beta^2 \|x\|^2, \quad (6)$$

where and $\beta$ is a regularization parameter and, as was described above with reference to equation (1), the double vertical bars represent the norm of the expression inside the double vertical bars. The norm may, for example, be evaluated as the Euclidean norm (2-norm) of the expression inside the double vertical bars. The formulation of the Tikhonov cost function $F_T$ in the form which is given by equation (19) may be referred to as a quadratic penalty method.

In the absence of any constraints a solution of x which minimises the Tikhonov cost function $F_T$ is given by:

$$x = (C^T \cdot C + \beta^2 I)^{-1} C^T \cdot d, \quad (7)$$

where I is an identity matrix. In general the Tikhonov cost function $F_T$ tends to increase with increasing $\beta$. One approach to finding a solution which satisfies the constraints could therefore be to search for the smallest value of the regularization parameter $\beta$ at which the constraints are satisfied. This could be achieved, for example, by varying the regularization parameter $\beta$ and evaluating the solution to check whether or not the constraints are satisfied.

Although the speed of these two known methods (ordinary least squares minimisation with strong damping and the Generalized-Tikhonov method) can be sufficiently fast to ensure that the time constraints for set-point computation are met, they both result in non-optimum minimisation. For example, the constraints of equation (2) may be considered to define a closed hyper-surface that encloses a hyper-volume (in the vector space that vector x lives in), with solutions that satisfy the constraints being inside the hyper-volume. Often the solution to the true, non-constrained, problem (i.e. the solution to equation (1) not constrained by equation (2)) will lie outside of this hyper-volume. Both of the two known methods discussed above can result in solutions that lie within the hyper-volume but which are not at, or close to the hyper-surface such that better solutions (which are closer to the true, unconstrained solution) that satisfy the constraints exist. Neither of these known methods explores the full solution space.

The cost function F which was previously given by equation (1) may be effectively rewritten (neglecting terms that are not dependent on vector x) as:

$$F(x) = \tfrac{1}{2} x^T \cdot H \cdot x + f^T \cdot x, \quad (8)$$

where $$H = C^T \cdot C \quad (9)$$

and $$f = -C^T \cdot d \quad (10)$$

The minimisation problem may then be summarised as minimising the cost function as given by equations (8)-(10) subject to the constraints as expressed by equation (2). This type of problem (a linearly constrained quadratic optimization problem) can be solved by a technique known as quadratic programming. Indeed, quadratic programming would offer the best performance (i.e. an optimum solution that satisfies the constraints) however the calculation is typically too slow to satisfy the time constraints for set-point computation that are imposed for a lithographic exposure process. For example, one known algorithm for solving a quadratic programming problem (the active set method) has been found to provide good performance for all use cases but is too slow for the lithographic exposure process. Another potential problem with known algorithms for solving quadratic programming problems (such as the active set method) is that it allows corrections which, although potentially better than other methods (for example ordinary least squares minimisation with strong damping and the Generalized-Tikhonov method), are also closer to machine limits. In turn, this could be problematic for other subsystems of the machine.

An embodiment of the present invention provides a new algorithm which can optimize the least squares minimisation whilst satisfying the constraints and ensuring that the calculation is performed within a typical timing budget for a lithographic exposure process.

The constraints of equation (2) can be combined with the cost function of equation (8) using the method of Lagrange multipliers, as now discussed.

The constraints of equation (2) can be re-written as:

$$\tilde{A} \cdot x \le b, \quad (11)$$

where $$\tilde{A} = \begin{pmatrix} -A \\ A \end{pmatrix} \quad (12)$$

and $$b = \begin{pmatrix} -b_l \\ b_u \end{pmatrix}. \quad (13)$$

Here, $\tilde{A}$ can be considered to be a two component vector, each component being a matrix with $n_c \times n_v$ elements, and b can be considered to be a two component vector (in the same vector space), each component being a vector with $n_c$ elements.

Equation (11) can be re-written by introducing slack variables:

$$\tilde{A} \cdot x + s = b, \quad (14)$$

where s is a vector of slack variables and $$s \ge 0. \quad (15)$$

Vector s can be considered to be a two component vector (which lives in the same vector space as $\tilde{A}$ and b), each component being a vector with $n_c$ elements.

According to an embodiment of the present invention, a new algorithm is provided which involves an iterative penalty method for solving a system represented by the following Lagrangian:

$$\mathcal{L}(x, s, \lambda) = \tfrac{1}{2} x^T \cdot H \cdot x + f^T \cdot x + \sum_i \lambda_i (\tilde{A} \cdot x + s - b)_i + \sum_i \tfrac{\rho_k}{2} p(s_i), \quad (16)$$

where $\lambda_i$ are a set of $2n_c$ Lagrange multipliers (one for each of the $2n_c$ constraints of equation (14)), $\rho_k$ is a penalty strength and $p(s_i)$ is a penalty function given by:

$$p(s_i) = \begin{cases} s_i^2 & \text{if } s_i < 0 \\ 0 & \text{if } s_i \leq 0 \end{cases}. \quad (17)$$

It will be appreciated that the penalty function may take different forms in other embodiments. However, generally, the penalty function will be zero if the constraint is satisfied (i.e. the slack variable is not negative) and will be non-zero if the constraint is violated, the non-zero value being indicative of how much the constraint is violates (i.e. how far away from the allowed region the current solution is in that direction in parameter space).

The equations of motion of this system are found by setting the partial derivative of the Lagrangian $\mathcal{L}(x,s,\lambda)$ with respect to x, s and $\lambda_i$ to zero:

$$\frac{\partial \mathcal{L}}{\partial x} = H \cdot x + f + \tilde{A}^T \cdot \lambda = 0, \quad (18)$$

$$\frac{\partial \mathcal{L}}{\partial s_i} = \lambda_i + \rho_k \delta_i s_i = 0, \text{ and} \quad (19)$$

$$\frac{\partial \mathcal{L}}{\partial \lambda} = \tilde{A} \cdot x + s - b = 0, \quad (20)$$

where $\lambda$ is a vector whose components are the set of $2n_c$ Lagrange multipliers $\lambda_i$ and the ($2n_c$) delta variables $\delta_i$ are given by:

$$\delta_i = \begin{cases} 1 & \text{if } s_i < 0 \\ 0 & \text{if } s_i \geq 0 \end{cases}. \quad (21)$$

Note that vector $\lambda$ can be considered to be a two component vector (which lives in the same vector space as $\tilde{A}$, b and s), each component being a vector with $n_c$ elements.

Equations (18), (19) and (20) can be combined as a linear system in the form:

$$B \cdot x = y \quad (22)$$

where $$B = H + \rho_k \tilde{A}^T \delta \tilde{A} \quad (23)$$

and $$y = -f + \rho_k \tilde{A}^T \delta b. \quad (24)$$

Here $\delta$ is a square diagonal matrix with $2n_c \times 2n_c$ elements, the $2n_c$ diagonal elements being the delta variables $\delta_i$ as defined by equation (21). In the vector space that $\tilde{A}$ lives in, matrix delta may be considered to be a 2×2 diagonal matrix, each of the diagonal components being a matrix with $n_c \times n_c$ elements:

$$\delta = \begin{pmatrix} \delta_1 & 0 \\ 0 & \delta_2 \end{pmatrix}, \quad (25)$$

where each of the two matrices $\delta_1$, $\delta_2$ is a square diagonal matrix with $n_c \times n_c$ elements, the $n_c$ diagonal elements being a subset of the delta variables $\delta_i$ as defined by equation (21).

Matrix B may be referred to as a configuration determining matrix. As can be seen from equation (23), matrix B is a sum of matrix H and a matrix which is proportional to the penalty strength, namely matrix $\rho_k \tilde{A}^T \delta \tilde{A}$. Matrix H is dependent on the dependencies of the optical properties of the projection system on a configuration of the manipulators (see equation (9)) and may be referred to as an unconstrained configuration determining matrix.

Vector y may be referred to as a configuration determining vector. As can be seen from equation (24), vector y is a sum of: vector $-f$ and a vector which is proportional to the penalty strength, namely vector $\rho_k \tilde{A}^T \delta b$. Vector $-f$ is dependent on the dependencies of the optical properties of the projection system on a configuration of the manipulators and the desired wavefront pattern (see equation (10)). Vector y may be referred to as an unconstrained configuration determining matrix.

Note that equations (22) to (24) are independent of the Lagrange multipliers $\lambda_i$ and the slack variables but are dependent on the delta variables $\delta_i$ as defined by equation (21).

It is worth noting that, since the constraints are linear, the Lagrange multiplier terms in the Lagranian of equation (16) are linear in the slack variables $s_i$, which, in turn, means that equation (20) is linear in the vector of slack variables s. In addition, since the penalty function $p(s_i)$ is a quadratic function of the slack variables $s_i$, equation (19) is also linear in the slack variables. This simplifies the elimination of the Lagrange multipliers $\lambda_i$ and the slack variables $s_i$ from the equations of motion to derive equations (22) to (24).

Figure 2:
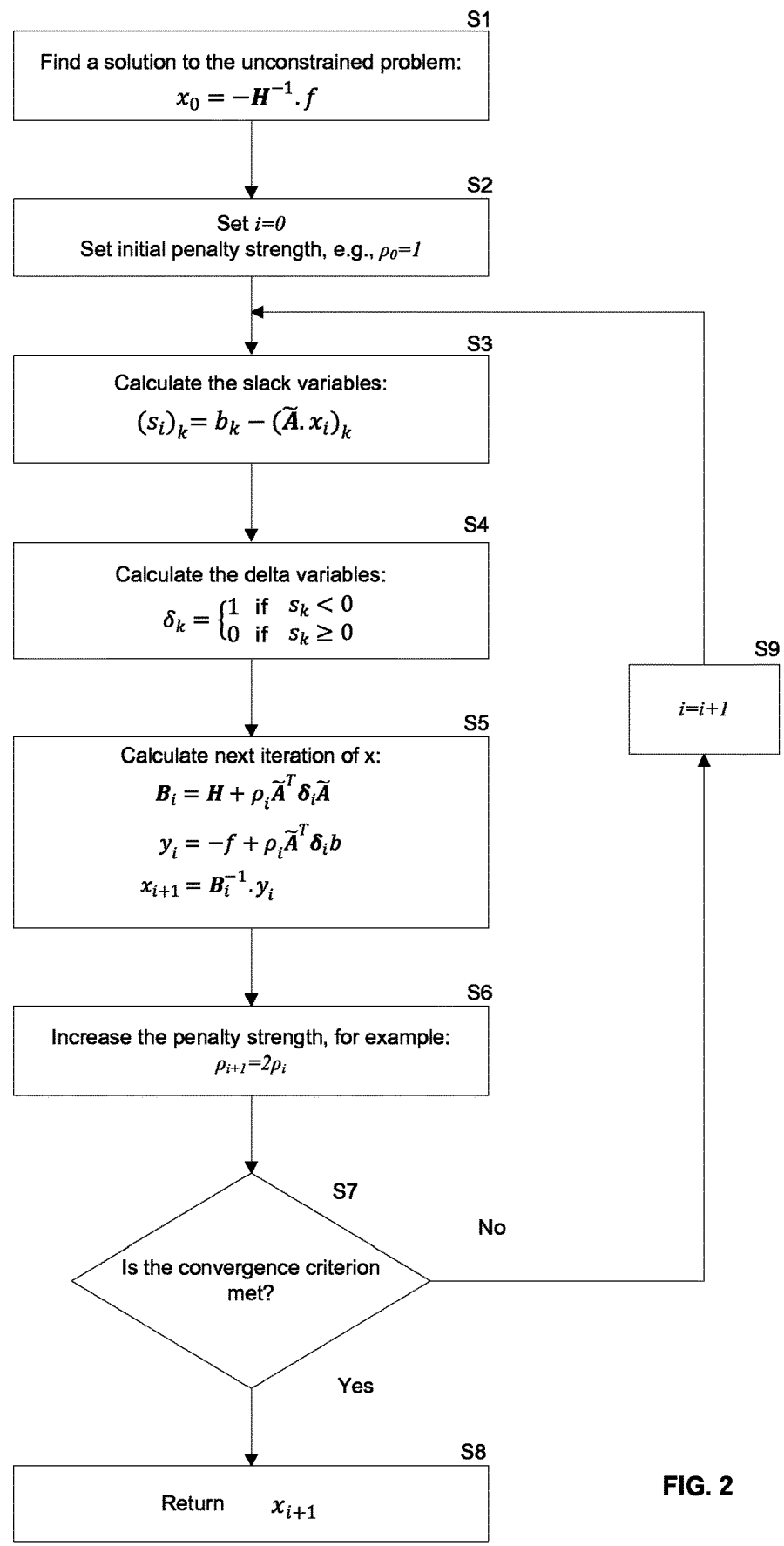
FIG. 2 is a flow chart representing a method of determining a configuration of a projection system of the lithographic apparatus shown in FIG. 1.

FIG. 2 is a flow diagram which outlines the steps of a method according to an embodiment of the invention. At step S1 an initial configuration $x_0$ of the manipulators MN is determined as a solution to the unconstrained problem (i.e. a solution to equation (8) in the absence of the constraints of equation (2)). Note that, in general, the solution to the unconstrained problem lies outside a hyper-volume defined by the constraints (and is therefore not achievable). At step S2, an iteration index i is set to 0 and an initial penalty value $\rho_0$ is set. In this example the initial penalty value $\rho_0$ is set to 1 although it will be appreciated by the skilled person that this is merely an example and that different initial values may alternatively be used. In addition, the initial penalty value $\rho_0$ may be a parameter of the algorithm.

At step S3 all of the ($2n_c$) slack variables $s_k$ are calculated using the current configuration $x_i$ of the manipulators MN. Note that in FIG. 2, the index k indicates the kth element of a vector whereas the index i indicates that the value of the iteration index. This step effectively allows one to determine which constraints are currently violated (and have a negative slack value) and which constraints are satisfied by the current configuration $x_i$ of the manipulators MN in the iteration.

At step S4 all of the ($2n_c$) delta variables $\delta_k$ are calculated from the slack values that have been calculated at step S3 (using the current configuration $x_i$ of the manipulators MN).

At step S5 the configuration of the manipulators MN is updated. This may be achieved by first calculating matrix B and vector y (see equations (23) and (24)) for the current iteration and subsequently using these to solve equation (22). For example, the inverse of matrix B may be calculated and multiplied by vector y. It will be appreciated by the skilled person that rather than calculating matrix B and vector y separately and combining them to solve equation (22), in other embodiments, these steps may be performed as a single step, or may be split into a different set of sub-steps that are equivalent.

At step S6, the penalty strength $\rho_k$ is increased. It will be appreciated that the amount or factor by which the penalty strength $\rho_k$ is increased may vary for different embodiments. In the example shown in FIG. 2, the penalty strength $\rho_k$ is doubled. It will be appreciated that the strategy for increasing of the penalty strength may be optimized for a specific problem.

At step S7 the most recently calculated configuration of the manipulators MN is assessed to see whether or not a convergence criterion has been met. It will be appreciated that various different convergence criteria may be used at step S7 of the algorithm. The convergence criterion may be chosen in dependence on specific the problem. Examples of convergence criteria include: step size tolerance, stagnation of the number of active constraints, and stagnation of the cost function. For example, step size tolerance can be used to determine an optimal configuration has been achieved, whereby if the iterative update steps are significantly below physical machine tolerances or achieve a preset numerical precision then the convergence criterion may be deemed to be met. Similar reasoning can be used to select the stagnation of the overall objective function as a stopping criterion, whereby if the gain in precision is below physical machine tolerances then the convergence criterion may be deemed to be met. Additionally or alternatively, when the number of active constraints stagnates, the algorithm can be considered to have attained the optimum such that the convergence criterion may be deemed to be met. It will be appreciated that a combination of any of the above-described convergence criteria may be used at step S7. That is, at step S7 the most recently calculated configuration of the manipulators MN may be assessed to see whether or not one of a plurality of stopping criteria have been met.

In the event that the convergence criterion has been met, at step S8 the algorithm returns the current configuration of the manipulators MN $x_{i+1}$ as the solution. If the convergence criterion has not yet been met then the index i is increment by 1 at step S9 and the method returns to step S3. A further update to the configuration of the manipulators is computed at step S3.

The above-described method has a number of benefits, as now discussed.

The algorithm allows the solution to be approached from outside the feasible region as defined by the constraints of equation (2). One benefit of approaching the solution from outside the feasible region is that the initial solution does not need to be feasible. This is in contrast to other methods for solving quadratic programming problems wherein an initial solution should be selected from within the feasible region, which requires extra consideration or additional computational resources (in selecting the initial solution). The use of the matrix $\delta$ of delta variables $\delta_i$ allows multiple constraints to be accounted for in each iteration of the algorithm. The matrix $\delta$ of delta variables $\delta_i$ effectively selects out all of the constraints that are currently violated and these are accounted for by the penalty term $\Sigma_i \rho_k/2 p(s_i)$ in the Lagrangian of equation (16). As the penalty strength $\rho_k$ increases (with each iteration of the algorithm), the solution moves closer to the feasible region.

This approach, wherein allows multiple constraints are accounted for simultaneously in each iteration, is in contrast to, for example, the active set method for solving quadratic programming problems. The active set method requires each active constraint to be separately considered during each iteration of the algorithm. In general, the active set method requires at least iterations $n_{AS}$, with $n_{AS}$ being the number of active (satisfied equality) constraints in the solution point. By approaching the solution from outside the feasible region and simultaneously taking into account multiple violated constraints, the above-described method according to an embodiment of the invention will, in general, converge in fewer iterations and will require less computational resources to converge on a solution.

Increasing the penalty strength $p_k$ on each iteration progressively increases the condition number of the associated linear system. This makes solving that system harder and the solution more prone to numerical inaccuracies. The system can be rewritten as a coupled system of equations to, at least partially, alleviate these issues.

As is known in the art, the scale of the constraints and the bounds has an effect on the convergence behaviour of a minimisation algorithm. Therefore, in some embodiments, the constraints may be rescaled or normalized to decrease the number of iterations and linear system conditioning.

Figure 3:
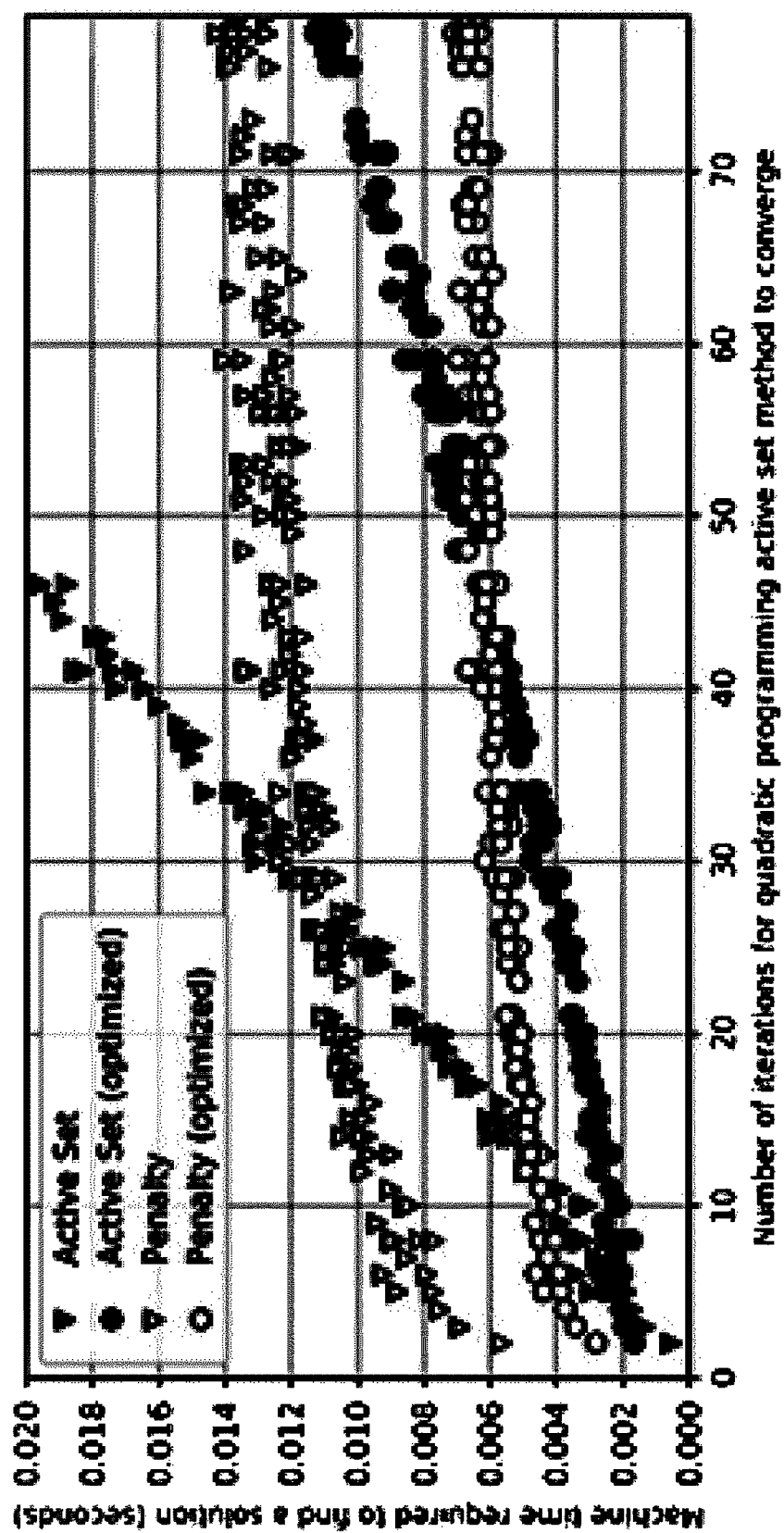
FIG. 3 shows, for two different implementations of an active set algorithm (see the solid circular and triangular markers) and two different implementations of the algorithm of FIG. 2 (see the circular and triangular markers in outline), the machine time (using a benchmark implementation) required to reach a solution against the required number of iterations of an active set method to reach the solution.

FIG. 3 shows a comparison of the above-described method with the known active set method for solving quadratic programming optimization problems. A variety of optimization problems were tested, each corresponding to a point in FIG. 3. The horizontal axis shows the required number of iterations of the active set method to reach the optimal solution. The vertical axis shows the machine time (using a benchmark implementation) required to reach that solution. Two different implementations of an active set algorithm are shown (see the solid circular and triangular markers) and two different implementations of the above-described algorithm are shown (see the circular and triangular markers in outline).

Relatively simple problems require a relatively low number of active set iterations and are situated towards the left hand side of the graph in FIG. 3. Conversely, relatively difficult quadratic programming optimization problems require a greater number of iterations and are shown towards the right hand side of the graph in FIG. 3.

As can be seen from FIG. 3, each of the two implementations of an active set algorithm (see the solid circular and triangular markers) show a generally linear correlation between the machine time required to reach a solution and the number of iterations of the active set method required to reach that solution. This would be expected if each iteration of the active set method requires approximately the same amount of computation time. The two gradients of the correlations for the two implementations of an active set algorithm are different, with the algorithm indicated by the solid triangular markers taking more computation time; and the algorithm indicated by the solid circular markers (an optimised algorithm) taking less computation time.

As can be seen from FIG. 3, for each of the two implementations of the new above-described penalty method algorithm (see the circular and triangular markers in outline) the machine time required to reach a solution also generally increases as the number of iterations of the active set method required to reach that solution increases. In particular, as a function of the number of iterations the active set method requires to reach a solution, the computation time for the new method rises steeply for small values of the number of iterations of the active set method required to reach a solution. Then for larger values of the number of iterations of the active set method required to reach a solution the computation time for the new method levels off slightly such that the gradient of the correlation for these larger values of the number of iterations of the active set method required to reach a solution is significantly smaller.

As a result of these trends, it can be seen that relatively easy problems that require only a few active set iterations can be solved quickest using the traditional (active set) method. However, harder problems which would require more than just a few active set iterations, are solved quicker with the new, above-described penalty method. This shows the potential of the proposed method in situations where many constraints are active at the solution point (which can often be the case when optimizing the configuration of the manipulators MN of the projection system PL of a lithographic apparatus).

An advantage of the quadratic programming based techniques over the known algorithms for optimizing the configuration of the manipulators MN of the projection system PL of a lithographic apparatus is the ability to optimally use the entire available manipulator range, as now described with reference to FIG. 4.

Figure 4:
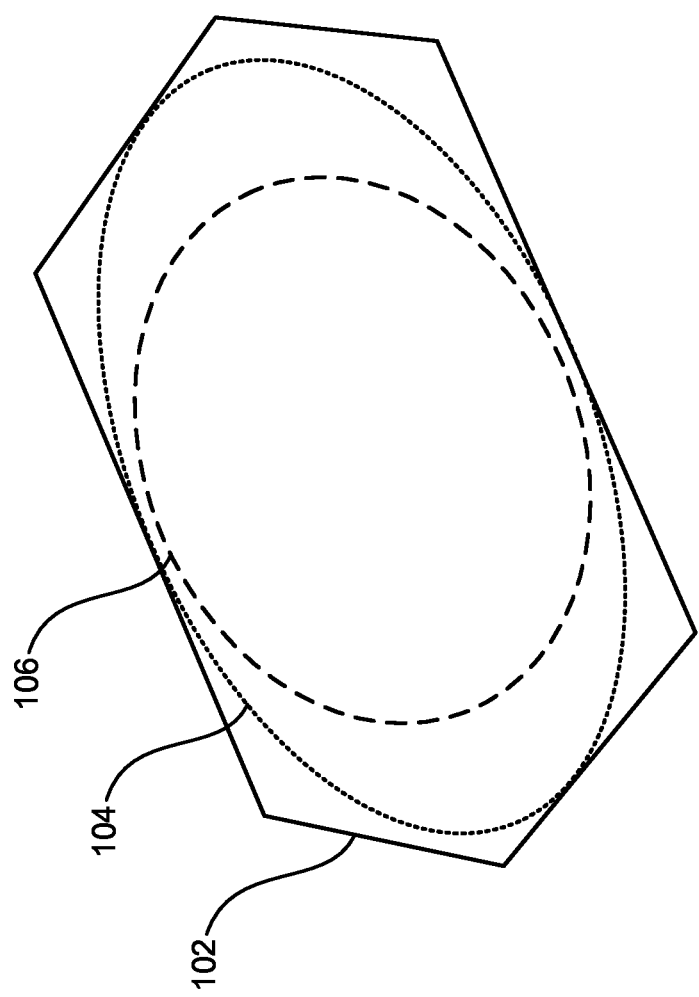
FIG. 4 is a schematic two-dimensional graphical representation of parameter space of the manipulators of the lithographic apparatus shown in FIG. 1, indicating the regions thereof that are explored by: a quadratic computing algorithm, a Generalized-Tikhonov method and a damped ordinary least squared algorithm.

FIG. 4 is a simplified two-dimensional graphical representation of parameter space of the manipulators MN. The two-dimensions which are shown in FIG. 3 may, for example, correspond to two variables on which the cost function F depends. The manipulator constraints are represented in FIG. 4 by a solid line 102. In the representation which is shown in FIG. 4, the constraints are satisfied if the current evaluation of the cost function F remains within the bounds of the solid line 102. Quadratic programming solutions such as the new above-described penalty algorithm (or the active set method) will explore substantially the entire feasible region within the bounds of the solid line 102. However, other known methods that are typically used for optimizing the configuration of the manipulators MN of the projection system PL of a lithographic apparatus will typically not explore entire feasible region. For example, the region 104 explored by a Generalized-Tikhonov method and the region 106 explored by a damped ordinary least squared algorithm are also schematically shown in FIG. 4.

The above-described method therefore allows correct global optimization of least squares problems whilst keeping actuators within range constraints (by exploring substantially the whole feasible region, unlike Generalized-Tikhonov methods and damped ordinary least squared algorithms) within a predictable and short calculation time (that, at least for more difficult problems, is fasted than traditional active set methods).

Whilst embodiments have been described above in which a minimum of a cost function is sought subject to some constraints, a resulting solution may not correspond to the exact minimum of the cost function subject to the constraints. For example, each method which is been presented herein may have limitations which do not allow an exact minimum to be found. Any reference herein to a minimum of a cost function should not therefore be interpreted to mean that an exact minimum is found but should instead be interpreted to mean that the cost function has been reduced to an extent that the limitations of the method allows. Limitations of the method may, for example, include an available amount of computational time in which the method is completed.

In some embodiments, a minimum to a cost function may only be sought to a given accuracy. For example, once a cost function has been reduced to a satisfactory extent, a method for minimising a cost function may be terminated in order to avoid the need for further computational expense which may be required to further reduce the cost function. In this case the cost function may still be considered to have been minimised since it has been minimised within the limitations of the method (which may include a limitation of available computational time).

In some embodiments the methods presented herein may be used to provide an initial estimate of a suitable manipulator configuration. The initial estimate may then be used as a starting point for a secondary method. For example, a minimum to a cost function may be sought to a given accuracy using a method described herein. The result of the method may then form an input to a secondary method which may seek to further minimise the cost function. For example, an active set method may be used further minimise the cost function. Providing a secondary method, such as an active set method, with an initial estimate may substantially reduce the computational time which is required for the secondary method to reach a solution since the starting point of the secondary method will be relatively close to an optimum solution. In embodiments in which the methods described herein are used to provide an input to the secondary method, the methods described herein may still be considered to substantially minimise a cost function even if the secondary method further minimises the cost function.

Any reference to a cost function being at a minimum may not necessarily correspond to an absolute minimum of the cost function. A minimum of a cost function may instead refer only to a local minimum. It should be further appreciated that any reference to being at a minimum should not be limited to being precisely at the minimum but merely substantially at the minimum.

Whilst embodiments have been described above in which a measurement system is of a transmissive type, in other embodiments a reflective type measurement system may be used. For example, the patterning device may comprise reflective patterned regions, the projection system may include one or more reflective optics and/or the detector regions may include reflective optics.

Aspects of the invention have been described above which may be carried out using a controller CN. The controller CN may comprise a computer and may, for example, include a CPU (central processing unit) which is configured to read and execute instructions stored in a volatile memory which takes the form of a random access memory. The volatile memory stores instructions for execution by the CPU and data used by those instructions.

Aspects of the invention may be implemented in any convenient form. For example, the invention may be implemented by appropriate computer programs which may be carried on appropriate carrier media which may be tangible carrier media (e.g. disks) or intangible carrier media (e.g. communications signals). Aspects of the invention may also be implemented using suitable apparatus which may specifically take the form of programmable computers running computer programs arranged to implement the invention.

While specific embodiments of the invention have been described above, it will be appreciated that the invention may be practiced otherwise than as described. The description is not intended to limit the invention. Thus it will be apparent to one skilled in the art that modifications may be made to the invention as described without departing from the scope of the clauses set out below. Other aspects of the invention are set out as in the following numbered clauses:

1. A method of determining a configuration of a projection system for a lithographic apparatus, wherein the projection system comprises a plurality of optical elements and a plurality of manipulators and wherein the manipulators are operable to manipulate the optical elements so as to adjust the optical properties of the optical elements, thereby adjusting the optical properties of the projection system, wherein the method is an implementation of a quadratic programming problem with a penalty function, the method comprising:

receiving dependencies of the optical properties of the projection system on a configuration of the manipulators;

receiving a plurality of constraints which correspond to the physical constraints of the manipulators;

finding an initial configuration of the manipulators, the initial configuration of the manipulators being a configuration that would achieve a desired wavefront pattern in the absence of the plurality of constraints; and repeating the following steps:
(a) determining a set of the plurality of constraints that are violated;
(b) determining an updated configuration of the manipulators, the updated configuration of the manipulators being dependent on the set of the plurality of constraints that are violated and a penalty strength; and
(c) increasing the penalty strength;

wherein steps (a) to (c) are repeated until a convergence criterion is met, the determined configuration of the projection system being the last updated configuration of the manipulators determined before the convergence criterion was met.

2. The method of clause 1 wherein in the determination of an updated configuration of the manipulators, the updated configuration of the manipulators is determined in dependence on all of the set of the plurality of constraints that are violated at substantially the same time.

3. The method of clause 1 or clause 2 wherein the penalty function is a quadratic penalty function.

4. The method of any preceding clause wherein determining an updated configuration of the manipulators involves: calculating a configuration determining matrix and a configuration determining vector, determining any inverse of the configuration determining matrix and determining the updated configuration by multiplying the inverse of the configuration determining matrix by the configuration determining vector.

5. The method of clause 4 wherein the configuration determining matrix is a sum of:
an unconstrained configuration determining matrix which is dependent on the dependencies of the optical properties of the projection system on a configuration of the manipulators; and
a matrix which is proportional to the penalty strength.

6. The method of clause 4 or clause 5 wherein the configuration determining vector is a sum of:
an unconstrained configuration determining vector which is dependent on: the dependencies of the optical properties of the projection system on a configuration of the manipulators, and the desired wavefront pattern; and
a vector which is proportional to the penalty strength.

7. The method of any preceding clause wherein the step of determining a set of the plurality of constraints that are violated comprises determining a slack variable for each of the plurality of constraints, the value of the slack variables indicating whether or not that constraint is violated.

8. The method of any preceding clause wherein the step of determining a set of the plurality of constraints that are violated comprises determining a delta variable for each of the plurality of constraints, the delta variable only being non-zero if that constraint is violated.

9. The method of any preceding clause wherein the step of increasing the penalty strength comprises doubling the penalty.

10. The method of any preceding clause wherein the convergence criterion includes any of the following: a step size tolerance, stagnation of the number of active constraints, or stagnation of the cost function.

11. The method of any preceding clause, further comprising determining the dependency of the optical properties of the projection system on the configuration of the manipulators.

12. The method of clause 11, wherein determining the dependency of the optical properties of the projection system on the configuration of the manipulators comprises changing the configuration of the manipulators and measuring a resulting change in the optical properties of the projection system.

13. The method of any preceding clause, further comprising adjusting the configuration of the manipulators to the solution configuration of the manipulators.

14. A method of performing a lithographic exposure comprising:
determining a configuration of a projection system of a lithographic apparatus according to the method of any of clauses 1 to 13;
adjusting the configuration of the projection system using the determined configuration;
projecting a patterned radiation beam onto a substrate using the projection system.

15. A computer readable medium carrying a computer program comprising computer readable instructions configured to cause a computer to carry out a method according to any one of clauses 1 to 13.

16. A computer apparatus comprising:
a memory storing processor readable instructions, and
a processor arranged to read and execute instructions stored in said memory, wherein said processor readable instructions comprise instructions arranged to control the computer to carry out the method according to any one of clauses 1 to 13.

17. A controller configured to control a projection system for a lithographic apparatus, wherein the projection system comprises a plurality of optical elements and a plurality of manipulators operable to manipulate the optical elements so as to adjust the optical properties of the optical elements, thereby adjusting the optical properties of the projection system, the controller being configured to implement a quadratic programming problem with a penalty function by:

receiving dependencies of the optical properties of the projection system on a configuration of the manipulators;

receiving a plurality of constraints which correspond to the physical constraints of the manipulators;

finding an initial configuration of the manipulators, the initial configuration of the manipulators being a configuration that would achieve a desired wavefront pattern in the absence of the plurality of constraints; and repeating the following steps:
(a) determining a set of the plurality of constraints that are violated;
(b) determining an updated configuration of the manipulators, the updated configuration of the manipulators being dependent on the set of the plurality of constraints that are violated and a penalty strength; and
(c) increasing the penalty strength;

wherein steps (a) to (c) are repeated until a convergence criterion is met, the determined configuration of the projection system being the last updated configuration of the manipulators determined before the convergence criterion was met.

18. A projection system for a lithographic apparatus, the projection system comprising:
    a plurality of optical elements;
    a plurality of manipulators operable to manipulate the optical elements so as to adjust the optical properties of the optical elements, thereby adjusting the optical properties of the projection system; and
    a controller according to clause 17.

19. A lithographic apparatus comprising:
    an illumination system configured to condition a radiation beam;
    a support structure constructed to support a patterning device, the patterning device being capable of imparting the radiation beam with a pattern in its cross-section to form a patterned radiation beam;
    a substrate table constructed to hold a substrate; and
    a projection system according to clause 18.

The invention claimed is:

1. A method of determining a configuration of a projection system, wherein the projection system comprises a plurality of optical elements and a plurality of manipulators and wherein the manipulators are operable to manipulate the optical elements so as to adjust one or more optical properties of the projection system, wherein the method is an implementation of a quadratic programming problem with a penalty function, the method comprising:
    receiving dependencies of the one or more optical properties of the projection system on a configuration of the manipulators;
    receiving a plurality of constraints which correspond to physical constraints of the manipulators;
    finding an initial configuration of the manipulators, the initial configuration of the manipulators being a configuration causing a wavefront pattern in the absence of the plurality of constraints; and
    repeating the following steps:
        (a) determining a set of the plurality of constraints that are violated;
        (b) determining an updated configuration of the manipulators, the updated configuration of the manipulators being dependent on the set of the plurality of constraints that are violated and a penalty strength; and
        (c) increasing the penalty strength;
    wherein steps (a) to (c) are repeated until a convergence criterion is met, the determined configuration of the projection system being the last updated configuration of the manipulators determined before the convergence criterion was met.

2. The method of claim 1, wherein, in the determination of an updated configuration of the manipulators, the updated configuration of the manipulators is determined in dependence on all of the set of the plurality of constraints that are violated at the same step.

3. The method of claim 1, wherein the penalty function is a quadratic penalty function.

4. The method of claim 1, wherein determining an updated configuration of the manipulators involves:
    calculating a configuration determining matrix and a configuration determining vector,
    determining any inverse of the configuration determining matrix, and
    determining the updated configuration by multiplying the inverse of the configuration determining matrix by the configuration determining vector.

5. The method of claim 4, wherein the configuration determining matrix is a sum of:
    an unconstrained configuration determining matrix which is dependent on the dependencies of the one or more optical properties of the projection system on a configuration of the manipulators; and
    a matrix which is proportional to the penalty strength.

6. The method of claim 4, wherein the configuration determining vector is a sum of:
    an unconstrained configuration determining vector which is dependent on: the dependencies of the one or more optical properties of the projection system on a configuration of the manipulators, and the wavefront pattern; and
    a vector which is proportional to the penalty strength.

7. The method of claim 1 wherein the determining a set of the plurality of constraints that are violated comprises determining a slack variable for each of the plurality of constraints, the value of the slack variables indicating whether or not that constraint is violated.

8. The method of claim 1, wherein the determining a set of the plurality of constraints that are violated comprises determining a delta variable for each of the plurality of constraints, the delta variable only being non-zero if that constraint is violated.

9. The method of claim 1, wherein the increasing the penalty strength comprises doubling the penalty strength.

10. The method of claim 1, wherein the convergence criterion includes any selected from: a step size tolerance, stagnation of the number of active constraints, or stagnation of the cost function.

11. The method of claim 1, further comprising determining the dependency of the one or more optical properties of the projection system on the configuration of the manipulators.

12. The method of claim 11, wherein determining the dependency of the one or more optical properties of the projection system on the configuration of the manipulators comprises changing the configuration of the manipulators and measuring a resulting change in the one or more optical properties of the projection system.

13. The method of claim 1, further comprising adjusting the configuration of the manipulators to the last updated configuration of the manipulators.

14. A controller configured to control a projection system, wherein the controller is configured to implement the method of claim 1.

15. A projection system for a lithographic apparatus, the projection system comprising:
    a plurality of optical elements;
    a plurality of manipulators operable to manipulate the optical elements so as to adjust one or more optical properties of the projection system; and
    the controller according to claim 14.

16. A computer program product comprising a non-transitory computer-readable medium having instructions, the instructions, upon execution by a computer system, configured to cause the computer system to at least:
    receive dependencies of one or more optical properties of a projection system on a configuration of a plurality of manipulators of the projection system, wherein the manipulators are operable to manipulate a plurality of optical elements of the projection system so as to adjust the one or more optical properties of the projection system;

receive a plurality of constraints which correspond to physical constraints of the manipulators;

find an initial configuration of the manipulators, the initial configuration of the manipulators being a configuration causing a wavefront pattern in the absence of the plurality of constraints; and repeat the following steps as an implementation of a quadratic programming problem with a penalty function:
 (a) determine a set of the plurality of constraints that are violated;
 (b) determine an updated configuration of the manipulators, the updated configuration of the manipulators being dependent on the set of the plurality of constraints that are violated and a penalty strength; and
 (c) increase the penalty strength;

wherein steps (a) to (c) are repeated until a convergence criterion is met, a determined configuration of the projection system being the last updated configuration of the manipulators determined before the convergence criterion was met.

17. The computer program product of claim 16, wherein, in the determination of an updated configuration of the manipulators, the updated configuration of the manipulators is determined in dependence on all of the set of the plurality of constraints that are violated at the same step.

18. The computer program product of claim 16, wherein the penalty function is a quadratic penalty function.

19. The computer program product of claim 16, wherein the instructions configured to cause the computer system to determine an updated configuration of the manipulators are further configured to cause the computer system to:
 calculate a configuration determining matrix and a configuration determining vector,
 determine any inverse of the configuration determining matrix, and
 determine the updated configuration by multiplying the inverse of the configuration determining matrix by the configuration determining vector.

20. The computer program product of claim 16, wherein the instructions configured to cause the computer system to determine a set of the plurality of constraints that are violated are further configured to cause the computer system to determine a slack variable for each of the plurality of constraints, the value of the slack variables indicating whether or not that constraint is violated or determine a delta variable for each of the plurality of constraints, the delta variable only being non-zero if that constraint is violated.

* * * * *